(12) United States Patent
Raghavan et al.

(10) Patent No.: US 8,541,863 B2
(45) Date of Patent: Sep. 24, 2013

(54) DATA RETENTION IN A SINGLE POLY EPROM CELL

(75) Inventors: Venkat Raghavan, Union City, CA (US); Andrew Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 235 days.

(21) Appl. No.: 12/955,061

(22) Filed: Nov. 29, 2010

(65) Prior Publication Data

US 2012/0132975 A1    May 31, 2012

(51) Int. Cl.
*H01L 21/70*    (2006.01)

(52) U.S. Cl.
USPC ...... 257/506; 257/314; 257/409; 257/E29.02; 257/E29.3

(58) Field of Classification Search
USPC ................. 257/314, 409, 506, E29.3, E29.02
See application file for complete search history.

(56) References Cited

U.S. PATENT DOCUMENTS

| 6,372,557 | B1 * | 4/2002 | Leong | 438/142 |
| 6,790,736 | B2 * | 9/2004 | Wu | 438/316 |
| 2006/0226499 | A1 * | 10/2006 | Shimizu | 257/409 |
| 2008/0217664 | A1 * | 9/2008 | Wu et al. | 257/287 |

OTHER PUBLICATIONS

"Strain Engineering to Improve Data Retention Time in Nonvolatile Memory", R. Arghavani et al., IEEE Transactions on Electron Devices, vol. 54, No. 2, Feb. 2007, pp. 362-365.

* cited by examiner

*Primary Examiner* — Robert Huber
(74) *Attorney, Agent, or Firm* — Eugene C. Conser; W. James Brady; Frederick J. Telecky, Jr.

(57) ABSTRACT

An electrically programmable read only memory (EPROM) BIT cell structure formed on a semiconductor substrate comprises an N-type epitaxial layer formed on the semiconductor substrate, an N-type well region formed in the epitaxial layer, LOCOS field oxide formed at the periphery of the well region to define an active device region in the well region, a field oxide ring formed in the active region and space-apart from the LOCOS field oxide to define an EPROM BIT cell region, and an EPROM BIT cell formed in the EPROM BIT cell region.

2 Claims, 2 Drawing Sheets

DATA RETENTION IN A SINGLE POLY EPROM CELL

FIELD OF THE INVENTION

The present invention relates to structures and methods for improving data retention of electrically programmable read only memory (EPROM) BIT cells.

BACKGROUND OF THE INVENTION

In some integrated circuit applications, it is desirable to include dispersed single bit EPROM cells, as distinguished from multi-bit EPROM cell arrays, in the integrated circuit architecture. For example, EPROM BIT cells may be employed as trim elements in high voltage applications. It is important that all EPROM BIT cells dispersed across an IC wafer meet a common reliability specification.

EPROM BIT cells are commonly fabricated based upon a P-type MOSFET device that utilizes a single layer of polysilicon (single poly). FIGS. 1A and 1B show a conventional EPROM BIT cell structure 100. The EPROM BIT cell structure 100 includes an N-type epitaxial layer 102 that has been grown on an underlying semiconductor substrate 104, typically P-type crystalline silicon. An N-type buried layer 106 is formed at the interface between the substrate 104 and the epitaxial layer 102. An N-type well 108 is formed in the epitaxial layer 102. Isolation oxide 110, typically "local oxidation of silicon" (LOCOS) oxide, is formed at the periphery of the N-well 108 to define an active device region. The LOCOS 110 extends in the direction of the arrow in FIG. 1B to the next device isolation. That is, the EPROM device region is surrounded by LOCOS field oxide on all sides. Thus, an isolated EPROM cell is surrounded by an extremely large field oxide that has been rapidly grown, using a high pressure oxidation process, to a thickness of ~10.5 kA. Mechanical stress is caused in the EPROM active channel region. Mechanical stress altered changes in the SiO₂/Si barrier height influence charge leakage from the floating gate as stated above, an EPROM BIT cell, that is, a PMOS transistor with a floating gate, is formed in the active device region. More specifically, as shown in FIG. 1B, a gate oxide layer 112 is formed on the upper surface of the N-well 108. A conductive floating gate 114, typically N-doped polysilicon, is formed on the gate oxide layer 112. The FIG. 1B structure 100 shows oxide spacers 116 formed on the sidewalls of the N-doped poly gate 114. A P+ source region 118 is formed in the N-well 108 at one side of the floating gate 114. A P+ drain region 120 is formed in the N-well 108 at the other side of the floating gate 114 to be spaced apart from the source region 118 to define a n-channel region therebetween. As shown in FIG. 1B, the floating gate 114 overlies the n-channel region. An N+ body contact region 122 is formed in the N-well 108 between the source region 118 and the LOCOS isolation oxide 110. FIG. 1B further shows a Metal 1 interconnect layer 124 that is formed over the EPROM BIT cell structure and separated therefrom by intervening dielectric material 126. Conductive contacts 128 extend through the dielectric layer 126 to provide electrical contact between the source region 118, the body contact region 122 and the drain region 120. As shown in FIG. 1B, the source and body contacts are butted, i.e., there are no separate contacts to the source and body. The Metal1 from the source connect shields the floating gate 114; while this scheme does not impact data retention, it does tighten the initial read current from the EPROM BIT cell 100. The initial read of an un-programmed cell of this type is done by applying a source-drain potential of 1V. The typical value of an un-programmed cell read current is 15 nA. Those skilled in the art will appreciate that the above-described EPROM BIT cell structure may be fabricated utilizing well known integrated circuit processing techniques.

Because the gate of the PMOS transistor is floating in the above-described EPROM BIT cell, it can be used as a charge storage device. Charge injection into the floating gate is done by applying a minimum source-drain potential of 8V. This bias causes a programming current of at least 350 μA to flow through the device. The programming current is a result of a combination of capacitive coupling between the source and the floating gate, drain-induced barrier lowering, and punch-through. This hole current generates electrons in the drain's high field region by impact ionization. The resulting electrons are then injected into the gate oxide and accumulated in the floating gate. This negative gate charge induces a conductive inversion layer at the Si/SiO₂ interface of the PMOS device, and the device becomes essentially a depletion-mode transistor.

Read of the programmed EPROM cell is done by applying a source-drain bias of 1V. The read current of a programmed cell is approximately 80 μA at time zero (i.e., prior to bake).

After bake at 250° C. for 86 hours, the EPROM cell should not lose more than 50% of the initial programmed charge in order to reliably distinguish between programmed and un-programmed EPROM BIT cells.

The isolation process utilized for the above-described single poly, PMOS EPROM cell is LOCOS field oxide. The field oxide is grown with high pressure oxidation, which creates stress in the silicon substrate due to the rapid field oxide growth. The region of the EPROM cell where the poly floating gate of the EPROM cell lies on the edge of the LOCOS field oxide's well known "bird's beak" is the region of maximum stress in silicon. Potentially, a local weakness in the gate oxide is created, providing a path for charge leakage to the substrate through the locally weak gate oxide. For the isolated EPROM BIT cell, there is a very large field oxide region surrounding the cell and is worst case for stress in silicon. The EPROM cell is susceptible to charge loss of over 50% at wafer edge, which is creates unacceptable condition in which to distinguish a programmed cell from an un-programmed cell. LOCOS oxidation on a high voltage process with a thick field oxide requirement sensitizes the mechanism. Stress could also come from other isolation processes, like shallow trench isolation (STI), or other oxidation and dielectric deposition processes. Advanced processes may use STI isolation for EPROM BIT cells.

Experimental data showing that compressive stress degrades retention time for non-volatile memory devices may be found in a publication by R. Arghavani et al. titled "Strain Engineering to Improve Data Retention Time in Nonvolatile Memory" (IEEE Transactions on Electron Devices, Vol. 54, No. 2, February 2007).

SUMMARY OF THE INVENTION

An embodiment of the present invention provides an electrically programmable read only memory (EPROM) BIT cell structure formed on a semiconductor substrate. The EPROM BIT cell structure comprises an N-type epitaxial layer formed on the semiconductor substrate, an N-type well region formed in the epitaxial layer, LOCOS field oxide formed at the periphery of the well region to define an active device region in the well region, a field oxide ring formed in the active device region and spaced-apart from the LOCOS field oxide to define an EPROM BIT cell region in the well region, and an EPROM BIT cell formed in the EPROM BIT cell region.

The features and advantages of the various aspects of the subject matter disclosed herein will be more fully understood and appreciated upon consideration of the following detailed description and the accompanying drawings, which set forth illustrative embodiments of the claimed subject matter.

DETAILED DESCRIPTION

Figure 1B:
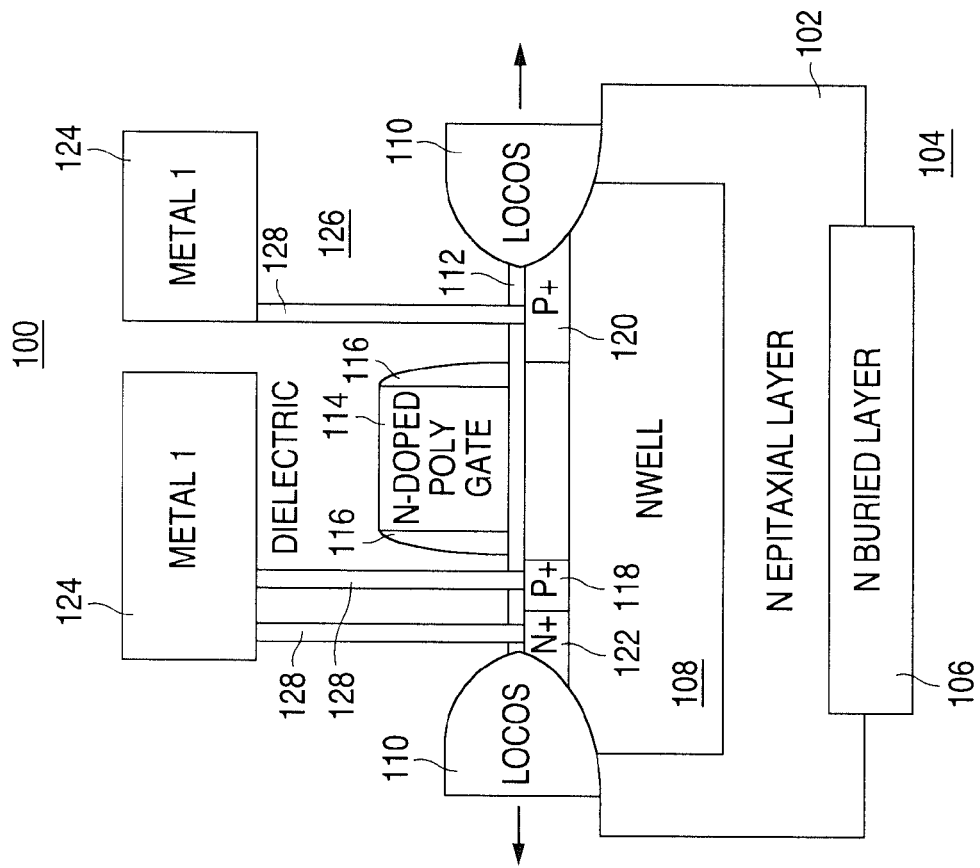
FIG. 1B illustrates a cross section of the FIG. 1A EPROM BIT cell structure taken along line X1-X1 in the FIG. 1A layout.
Figure 1A:
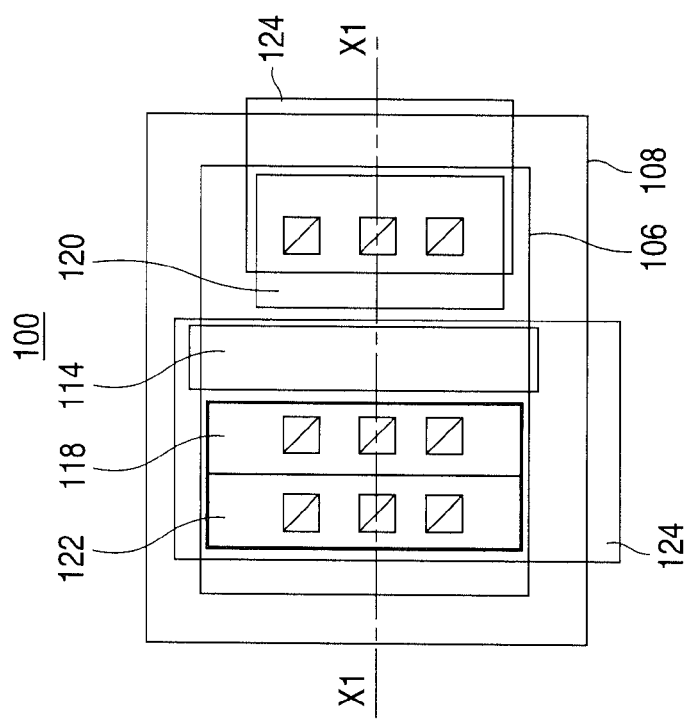
FIG. 1A is a plan view drawing illustrating the layout of a conventional EPROM BIT cell structure.
Figure 2A:
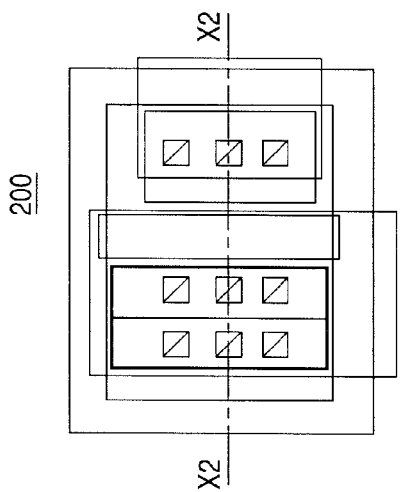
FIG. 2A is a plan view illustrating the layout of an embodiment of an EPROM BIT cell structure in accordance with the concepts of the present invention.
Figure 2B:
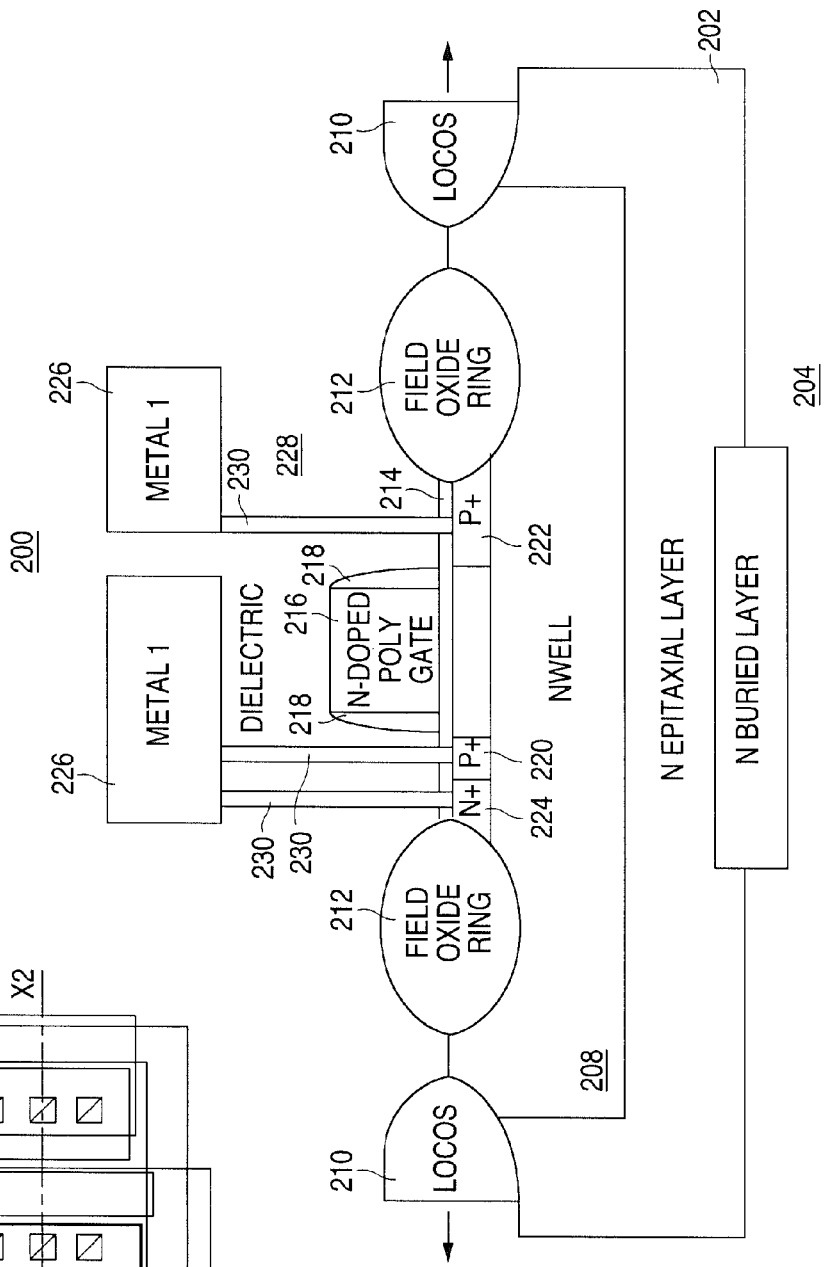
FIG. 2B illustrates a cross section of the FIG. 2A EPROM BIT cell structure taken along line X2-X2 in the FIG. 2A layout.

FIGS. 2A and 2B show an EPROM BIT cell structure 200 that, as described in greater detail below, includes a dummy field oxide ring that surrounds the EPROM BIT cell and is used as a stress relief layer. FIG. 2B is a cross-section drawing taken along line X2-X2 in the FIG. 2A layout.

AS shown in FIGS. 2A and 2B, the EPROM BIT cell structure 200 includes an N-type epitaxial layer 202 that has been grown on an underlying semiconductor substrate 204, typically P-type crystalline silicon. An N-type buried layer 206 is formed at the interface between the substrate 204 and the epitaxial layer 202. An N-type well 208 is formed in the epitaxial layer 202. Isolation oxide 210, typically LOCOS oxide, is formed at the periphery of the N-well 208 to define an active device region in the N-well 208. The LOCOS oxide extends in the direction of the arrow in FIG. 2B to the next device isolation. A field oxide ring 212 is formed in the active device region and spaced apart from the LOCOS oxide to define an EPROM BIT cell region in the N-well region. An EPROM BIT cell, that is, a PMOS transistor with a floating gate, is formed in the EPROM BIT cell region.

More specifically, as shown in FIG. 2B, a gate oxide layer 214 is formed on the upper surface of the N-well 208. A conductive floating gate 216, typically N-doped polysilicon, is formed on the gate oxide layer 214. The FIG. 2B structure shows oxide spacers 218 formed on the sidewalls of the N-doped poly gate 216. A P+ source region 220 is formed in the N-well 208 at one side of the floating gate 216. A P+ drain region 222 is formed in the N-well 208 at the other side of the floating gate to be spaced apart from the source region 220 to define an n-channel region therebetween. As shown in FIG. 2B, the floating gate 216 overlies the n-channel region. An N+ body contact region 224 is formed in the N-well 208 between the source region 220 and the field oxide ring 212. FIG. 2B further shows a Metal1 interconnect layer 226 that is formed over the EPROM BIT cell structure and separated therefrom by intervening dielectric material 228. Conductive contacts 230 extend through the dielectric material 228 to provide electrical contact between the source region 220, the body contact region 224 and the drain region 222. As shown in FIG. 2B, the source and body contacts are butted. The Metal 1 from the source connect shields the floating gate 216. As stated above, while this scheme does not impact data retention, it does tighten the initial read current from the EPROM BIT cell 200. The initial read of an un-programmed cell 200 is done by applying a source-drain potential of 1V. The typical value of an un-programmed read cell current is 15 nA.

Those skilled in the art will appreciate that the EPROM BIT cell structure 200 may be fabricated utilizing well known integrated circuit processing techniques.

Adding the field oxide ring 212 relieves stress in the EPROM BIT cell structure 200 at the interface between the N-well 208 and the gate oxide 214. Stress propagates from the LOCOS oxide to the device region. Mechanical stress has the effect of lowering the tunneling barrier of carriers stored in the floating gate. Hence, data loss occurs. An isolated BIT cell has the worst case stress on the BIT cell, since the LOCOS oxide is infinitesimally long in the vicinity of the BIT cell, the length being a function of stress. Adding the dummy field oxide ring at the minimum design rule, e.g. 1.5 μm, is sufficient to alleviate stress and improve data retention on a single BIT cell.

It should be understood that the particular embodiments described above have been provided by way of example and that other modifications may occur to those skilled in the art without departing from the scope and spirit of the invention as expressed in the appended claims and their equivalents.

What is claimed is:

1. A single poly electrically programmable read only memory (EPROM) cell with improved data retention comprising:

A P-type substrate, having top and bottom surfaces;

an N-type buried layer formed in the top surface of the P-type substrate;

an N-type epitaxial layer formed on the top surface of the P-type substrate and the N-type buried layer;

an N-type well region formed in the N-type epitaxial layer;

a LOCOS field oxide isolation formed at the periphery of the well region, extending outwardly from the N-type well region to the next device isolation, thereby defining the boundary of the N-type well region;

a field oxide stress relief ring formed in the N-type well region, extending inwardly and spaced-apart from the LOCOS field oxide isolation to define an EPROM BIT cell region in the N-type well region, wherein no contacts, additional diodes or guard rings exist between the field oxide stress relief ring and the LOCOS field oxide;

an EPROM BIT cell configured as a PMOS transistor, having a floating gate formed in the upper surface of the N-type well, contained within the field oxide stress relief ring;

wherein the EPROM BIT cell comprises:

a P+ source region formed within the field oxide stress relief ring;

a P+ drain region formed within the field oxide stress relief ring and spaced-apart from the source region to define a N-type channel region therebetween;

wherein the source region is spaced-apart from the field oxide stress relief ring, and further comprising an N-type contact region formed between the source region and the field oxide stress relief ring; and a conductive gate comprised of N-doped polysilicon formed over the channel region and separated therefrom by intervening dielectric material.

2. The EPROM cell structure of claim 1, wherein the field oxide stress relief ring is spaced-apart from the LOCOS field oxide isolation by greater than or equal to 1.5 μm.

* * * * *